(12) United States Patent
Hou et al.

(10) Patent No.: US 9,960,053 B2
(45) Date of Patent: May 1, 2018

(54) FINFET DOPING METHODS AND STRUCTURES THEREOF

(71) Applicant: Taiwan Semiconductor Manufacturing Company, Ltd., Hsin-Chu (TW)

(72) Inventors: Cheng-Hao Hou, Hsinchu (TW); Xiong-Fei Yu, Hsinchu (TW); Chia-Wei Hsu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 148 days.

(21) Appl. No.: 14/970,291

(22) Filed: Dec. 15, 2015

(65) Prior Publication Data

US 2017/0170027 A1    Jun. 15, 2017

(51) Int. Cl.
| | |
|---|---|
| *H01L 21/3215* | (2006.01) |
| *H01L 21/324* | (2006.01) |
| *H01L 21/283* | (2006.01) |
| *H01L 21/3205* | (2006.01) |
| *H01L 29/51* | (2006.01) |
| *H01L 29/423* | (2006.01) |

(Continued)

(52) U.S. Cl.
CPC .......... *H01L 21/324* (2013.01); *H01L 21/283* (2013.01); *H01L 21/28088* (2013.01); *H01L 21/28097* (2013.01); *H01L 21/28176* (2013.01); *H01L 21/3215* (2013.01); *H01L 21/32051* (2013.01); *H01L 21/32055* (2013.01); *H01L 29/0657* (2013.01); *H01L 29/42356* (2013.01); *H01L 29/4966* (2013.01); *H01L 29/4975* (2013.01); *H01L 29/51* (2013.01); *H01L 29/517* (2013.01)

(58) Field of Classification Search
CPC ............. H01L 21/324; H01L 21/28088; H01L 29/517; H01L 29/4975; H01L 29/4966; H01L 21/28176; H01L 21/28097; H01L 21/32051; H01L 21/32055; H01L 21/283; H01L 29/0657; H01L 29/42356; H01L 21/3215; H01L 29/51
See application file for complete search history.

(56) References Cited

U.S. PATENT DOCUMENTS

| | | | |
|---|---|---|---|
| 6,825,133 B2 | 11/2004 | Yu | |
| 7,667,247 B2 | 2/2010 | Wang | |

(Continued)

*Primary Examiner* — Joseph C Nicely
*Assistant Examiner* — Pavel Ivanov
(74) *Attorney, Agent, or Firm* — Haynes and Boone, LLP

(57) ABSTRACT

A method and structure for providing conformal doping of FinFET fin structures, for example by way of a thermal treatment process, includes forming a gate stack at least partially over a fin extending from a substrate. In various embodiments, a barrier metal layer is deposited over the gate stack. By way of example, a thermal fluorine treatment is performed, where the thermal fluorine treatment forms a fluorinated layer within the barrier metal layer, and where the fluorinated layer includes a plurality of fluorine atoms. In some embodiments, after forming the fluorinated layer, an anneal is performed to drive at least some of the plurality of fluorine atoms into the gate stack (e.g., into the interfacial layer and the high-K dielectric layer), thereby conformally doping the gate stack with the at least some of the plurality of fluorine atoms.

20 Claims, 8 Drawing Sheets

(51) Int. Cl.
*H01L 29/06* (2006.01)
*H01L 21/28* (2006.01)
*H01L 29/49* (2006.01)

(56) References Cited

U.S. PATENT DOCUMENTS

| | | | |
|---|---|---|---|
| 7,939,353 B1 | 5/2011 | Xu | |
| 8,106,469 B2 | 1/2012 | Xu | |
| 8,319,295 B2 * | 11/2012 | Collaert | H01L 21/28079 257/411 |
| 9,184,233 B2 | 11/2015 | van Dal | |
| 2008/0135984 A1 * | 6/2008 | Oh | H01L 21/28185 257/640 |
| 2015/0132938 A1 * | 5/2015 | Ahmed | H01L 29/517 438/591 |

* cited by examiner ies I DOPING METHODS AND
STRUCTURES THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In addition, high-permittivity (high-K) dielectric materials have been introduced in an effort to reduce gate oxide leakage current while maintaining a desired gate capacitance value. However, high-K dielectrics may suffer from high densities of interfacial and bulk defects, which could increase carrier scattering, degrade mobility, and reduce drain current. At least some efforts to reduce defect densities have included the incorporation of fluorine, for example, which has been shown to effectively passivate interfacial dangling bonds and bulk oxygen vacancies, which in turn may reduce oxide leakage current, improve threshold voltage stability, and generally improve device performance. For the fabrication of planar devices, fluorine incorporation may be achieved by an ion implantation process. However, attempts at fluorine incorporation into FinFET devices by ion implantation may damage the FinFET fins and may be ineffective to introduce fluorine uniformly across the entire three-dimensional geometry of the FinFET fins. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
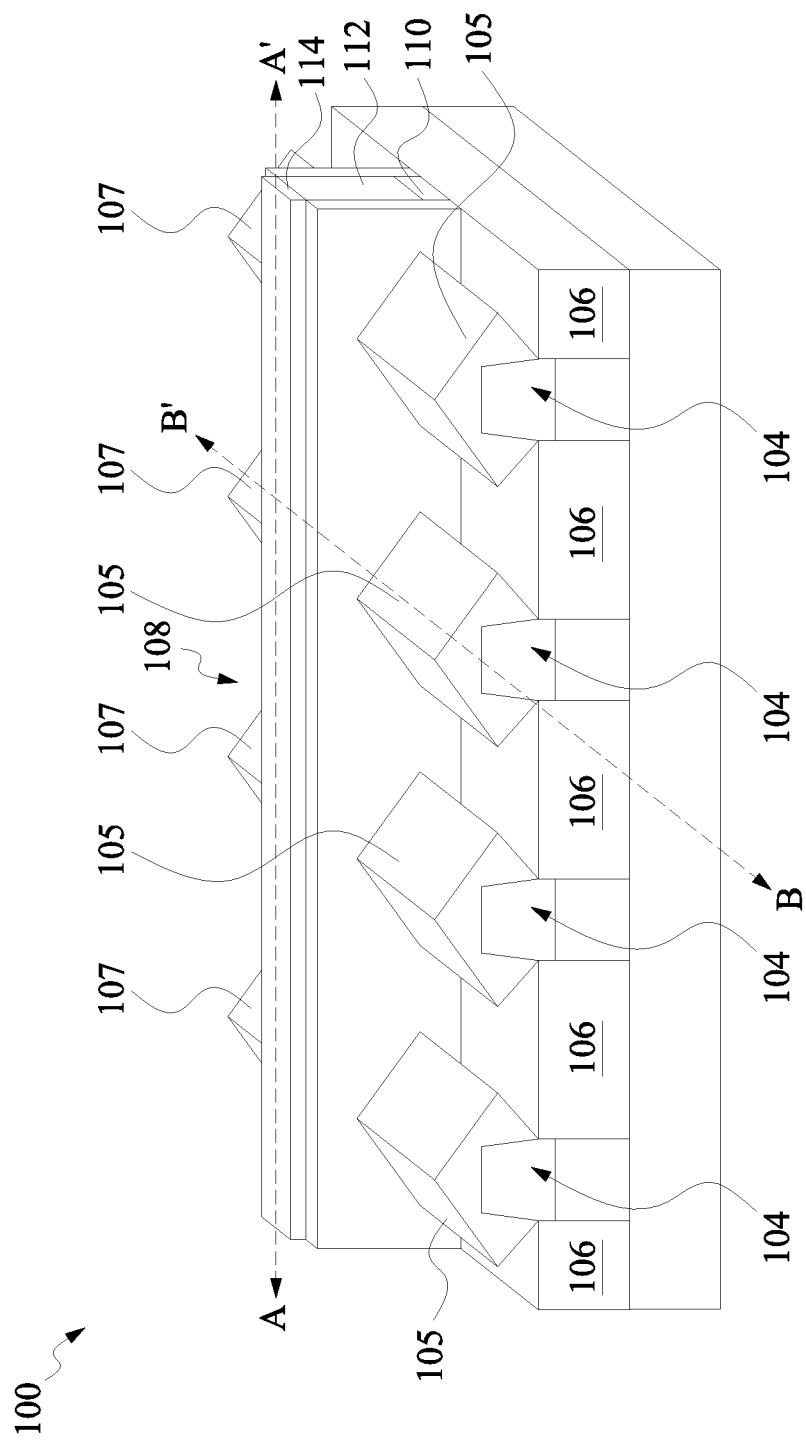
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

Illustrated in FIG. 1 is a FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include a silicon-on-insulator (SOI) structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the making element may be performed using an electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. A channel region of a transistor is disposed within the fin 104, underlying the gate structure 108, along a plane substantially parallel to a plane defined by section BB' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300 K) of around 1350 cm$^2$/V-s and a hole mobility of around 480 cm$^2$/V-s.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack having an interfacial layer 110 formed over the channel region of the fin 104, a gate dielectric layer 112 formed over the interfacial layer 110, and a metal layer 114 formed over the gate dielectric layer 112. The interfacial layer 110 may include a dielectric material such as silicon oxide layer ($SiO_2$) or silicon oxynitride (SiON). The interfacial layer 110 may be formed by chemical oxidation, thermal oxidation, atomic layer deposition (ALD), chemical vapor deposition (CVD), and/or other suitable method. The gate dielectric layer 112 may include a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, combinations thereof, or other suitable material. In still other embodiments, the gate dielectric layer may include silicon dioxide or other suitable dielectric. The dielectric layer may be formed by ALD, physical vapor deposition (PVD), oxidation, and/or other suitable methods. The metal layer 114 may include a conductive layer such as W, TiN, TaN, WN, Re, Ir, Ru, Mo, Al, Cu, Co, Ni, combinations thereof, and/or other suitable compositions. In some embodiments, the metal layer 114 may include a first metal material for N-type FinFETs and a second metal material for P-type FinFETs. Thus the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 114 may provide a gate electrode for the FinFET device 100, including both N-type and P-type FinFET devices 100. In some embodiments, the metal layer 114 may alternately include a polysilicon layer. The metal layer 114 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

In various embodiments, as discussed in more detail below, a fluorine treatment may be performed prior to forming the metal layer 114. Embodiments of a fluorine treatment method as disclosed herein may include deposition, removal, or other processing of additional layers prior to forming the metal layer 114. For example, in some cases, a layer of titanium silicon nitride (TiSiN) may be formed over the gate dielectric layer 112, and an anneal process is optionally performed. Thereafter, a thermal fluorine treatment process may be used to form a fluorinated layer of TiSiN. In some embodiments, a capping layer is formed over the fluorinated TiSiN, and an anneal is performed to drive-in fluorine atoms into the interfacial layer 110 and the gate dielectric layer 112, thereby passivating interfacial and/or bulk defects for each of the interfacial layer 110 and the gate dielectric layer 112. In various examples, the capping layer may then be removed, and the metal layer 114 may be formed over the layer of fluorinated TiSiN.

Fluorine has been shown to reduce defect densities, for example by passivation of interfacial dangling bonds and bulk oxygen vacancies, which in turn may reduce oxide leakage current, improve threshold voltage stability, and generally improve device performance. However, in at least some existing processes, fluorine incorporation is achieved by ion implantation. Fluorine incorporation into FinFET devices by ion implantation damages FinFET fins, thereby degrading FinFET performance. Further, fluorine ion implantation into FinFET devices may be ineffective to introduce fluorine atoms uniformly across the entire three-dimensional geometry of the FinFET fins.

Figure 2:
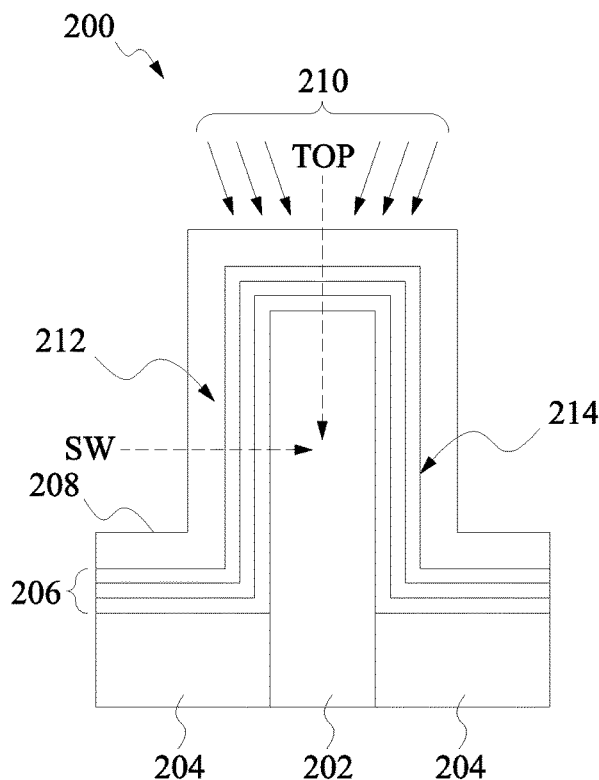
FIG. 2 is a cross sectional view of a FinFET device including implanted fluorine dopants.
Figure 3A:
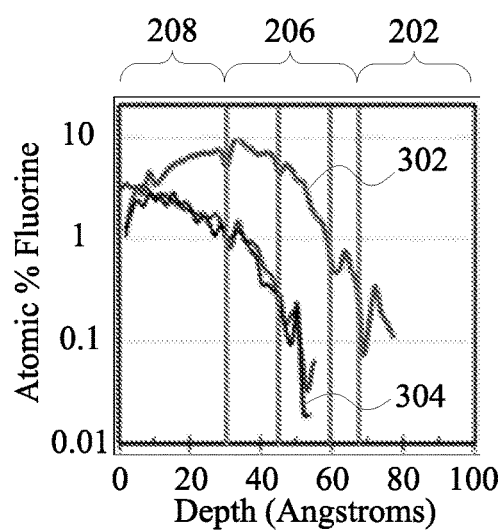
FIG. 3A provides simulated fluorine profiles, showing the atomic percent fluorine versus depth, and including a FinFET fin top profile and a FinFET fin sidewall profile.

Such shortcomings of using ion implantation to incorporate fluorine into a FinFET structure are illustrated with reference to FIGS. 2 and 3A/3B. FIG. 2 illustrates a cross sectional view of a FinFET device 200 including a fin 202 (e.g., extending from a substrate) and isolation regions 204. The device 200 may also include a gate stack 206 formed over the fin 202 and a capping layer 208, which may be formed over the gate stack 206 prior to a fluorine implant 210.

In at least some conventional processes, the fluorine implant 210 may be performed at an angle of about 7-8°, while rotating the device 200, to prevent channeling of the implanted ions. Angled ion implantation, even when the device 200 is rotated, may result in 'shadowing' effects (e.g., due to the three-dimensional geometry of the FinFET device 200). For example, with reference to FIG. 2, side portions 212, 214 of the device 200 may be shadowed during the implant 210 and thus not receive the full dose of the fluorine implant 210. Thus, reduction of defects within the gate stack 206 may not be effectively performed along the side portions 212, 214 of the device 200. To further illustrate the non-conformal nature of the fluorine implant 210, FIG. 3A provides simulated fluorine profiles, showing the atomic percent fluorine versus depth (e.g., into the device 200), and including a FinFET fin top profile 302 (along the direction 'Top' of FIG. 2) and a FinFET fin sidewall profile 304 (along the direction 'SW' of FIG. 2). Regions representing the gate stack 206, the capping layer 208, and the fin 202 are also shown in FIG. 3A. As illustrated therein, the fluorine dosage (i.e., the atomic percent fluorine) along the direction 'SW' (represented by the profile 304) is about 10× less than the fluorine dosage along the direction 'Top' (represented by the profile 302).

Figure 3B:
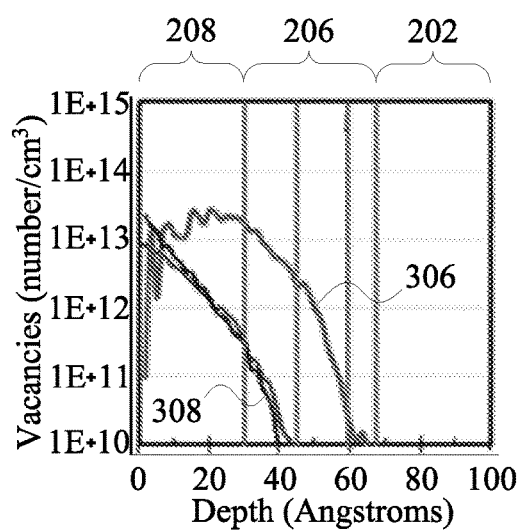
FIG. 3B provides simulated damage profiles, showing a number of vacancies versus depth, and including a FinFET fin top profile and a FinFET fin sidewall profile.

Additionally, the fluorine implant 210 may damage the crystal lattice structure (e.g., of the gate stack 206 and the fin 202) due to the highly energetic nature of the ion implantation process. FIG. 3B provides simulated damage profiles, showing a number of vacancies (per $cm^3$) versus depth, again including a FinFET fin top profile 306 (along the direction 'Top' of FIG. 2) and a FinFET fin sidewall profile 308 (along the direction 'SW' of FIG. 2). As shown, the damage (e.g., number of vacancies) is higher along the direction 'Top' (represented by the profile 306), which is more directly exposed to the implant 210. While a high-temperature anneal may be performed to try to remove such ion implantation damage, the crystal structure of an ion-implanted material may not be fully restored to its pre-implant condition. Thus, FinFET devices fabricated using such ion-implanted fins would be expected to have degraded physical and electrical properties.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing conformal doping of FinFET fin structures, for example by way of a thermal treatment process, so as to avoid damage caused by ion implantation and to provide conformal doping of three-dimensional FinFET fin structures. In some embodiments, "conformal doping" is used herein is used to describe doping of layers formed over FinFET fins (e.g., interfacial, high-K, and/or metal barrier layers), wherein a dopant concentration of a layer formed over a top portion of a given FinFET fin is substantially the same as a dopant concentration of the same layer formed over a side portion of the given FinFET fin. In some embodiments, after formation of a FinFET gate stack dielectric layers, and prior to formation of a gate metal layer, a fluorine treatment may be performed. For example, in some embodiments, a layer of titanium silicon nitride (TiSiN) may be formed over the FinFET gate stack dielectric layers. In some examples, an in situ post metallization anneal (PMA) may then be performed. Thereafter, in various embodiments, a thermal fluorine treatment process may be performed such that a portion of the TiSiN layer becomes fluorinated, thereby forming a fluorinated layer of TiSiN. In some embodiments, a capping layer may then be formed over the fluorinated layer of TiSiN. In various illustrations, a post capping anneal (PCA) is performed to drive-in fluorine atoms into the FinFET gate stack dielectric layers, thereby passivating interfacial and/or bulk defects for any of a plurality of layers which make up the FinFET gate stack dielectric layers. In various embodiments, after the PCA, the capping layer may be removed, and the FinFET gate metal layer may be formed.

Figure 4:
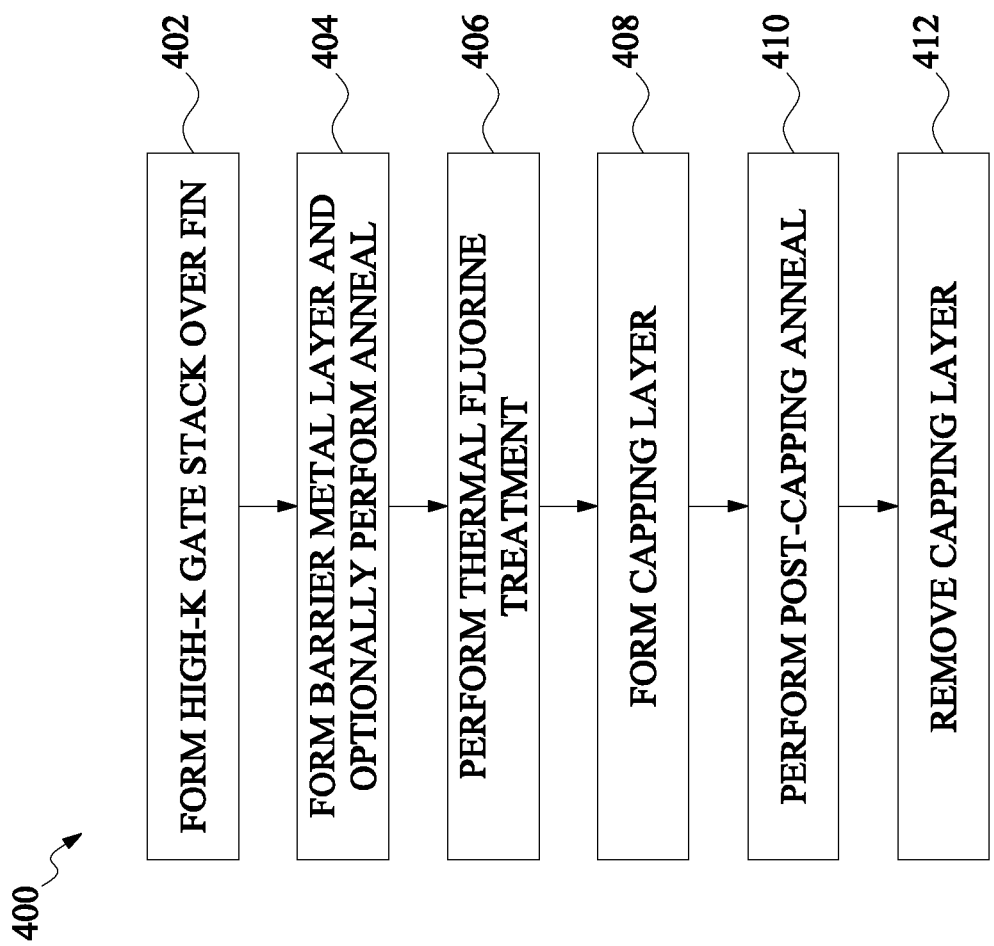
FIG. 4 is a flow chart of a method of fabricating a FinFET device according to one or more aspects of the present disclosure.

Referring now to FIG. 4, illustrated is a method 400 of fabricating a semiconductor device including a FinFET device. The method 400 may be used to implement a fin-based semiconductor device including methods for providing conformal doping of three-dimensional FinFET fin structures. In some embodiments, the method 400 may be used to fabricate the device 100, described above with reference to FIG. 1. Thus, one or more aspects discussed above with reference to the device 100 may also apply to the method 400. Additionally, FIGS. 5A-5D and 6A-6E are cross-sectional views of an exemplary device 500 fabricated according to one or more steps of the method 400 of FIG. 4.

It is understood that parts of the method 400 and/or the semiconductor device 500 may be fabricated by a well-known complementary metal-oxide-semiconductor (CMOS) technology process flow, and thus some processes are only briefly described herein. In addition, as described above, the device 500 may share aspects of the device 100, thus some aspects and/or processes of the device 500 are only discussed briefly for purposes of clarity in understanding. Further, the semiconductor device 500 may include various other devices and features, such as additional transistors, bipolar junction transistors, resistors, capacitors, diodes, fuses, etc., but is simplified for a better understanding of the inventive concepts of the present disclosure. Further, in some embodiments, the semiconductor device 500 includes a plurality of semiconductor devices (e.g., transistors), which may be interconnected.

In various embodiments, the device 500 may be an intermediate device fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Referring now to the method 400, the method 400 begins at block 402 where a high-K gate stack is formed. As used below, the term "high-K gate stack" may be used to describe a high-K gate dielectric layer formed over an interfacial layer. Referring to the example of FIG. 5A, and in an embodiment of block 402, illustrated therein is a semiconductor device structure 500 including a fin element 504 extending from a substrate 502. The substrate 502 and fin element 504 may be substantially similar to the substrate 102 and the fin elements 104 discussed above with reference to the device 100 of FIG. 1. In some embodiments, a high-K gate stack 506 is formed on the device 500 at least partially over the fin element 504. By way of example, the high-K gate stack 506 may include an interfacial layer and a high-K dielectric layer formed over the interfacial layer. High-K gate dielectrics, as used and described herein, include dielectric materials having a high dielectric constant, for example, greater than that of thermal silicon oxide (~3.9). Additionally, the formation of the high-K gate stack 506, including the interfacial layer and the high-K dielectric layer, may include depositions to form various gate stack materials and one or more chemical mechanical polishing (CMP) processes to remove excessive gate stack materials and thereby planarize a top surface of the semiconductor device 500.

In some embodiments, the interfacial layer of the high-K gate stack 506 may be substantially similar to the interfacial layer 110 discussed above with reference to the device 100 of FIG. 1. Thus, in some examples, the interfacial layer of the high-K gate stack 506 may include a dielectric material such as $SiO_2$, HfSiO, or SiON. In various embodiments, the high-K dielectric layer of the high-K gate stack 506 may be substantially similar to the gate dielectric layer 112 discussed above with reference to the device 100 of FIG. 1. Thus, in various examples, the high-K dielectric layer of the high-K gate stack 506 may include a dielectric layer such as $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. Each of the interfacial layer and the high-K dielectric layer of the high-K gate stack 506 may be formed by ALD, physical vapor deposition (PVD), CVD, chemical oxidation, thermal oxidation, and/or other suitable methods.

The method 400 then proceeds to block 404 where a barrier metal layer is formed over the high-K gate stack 506. Again referring to the example of FIG. 5A, and in an embodiment of block 404, a barrier metal layer 508 is formed over the high-K gate stack 506. In some embodiments, the barrier metal layer 508 may include titanium silicon nitride (TiSiN). In various embodiments, other materials such as titanium nitride (TiN), tantalum silicon nitride (TaSiN), tantalum nitride (TaN), and/or combinations thereof may also be used to form the barrier metal layer 508. By way of example, the barrier metal layer 508 may be deposited, under vacuum in an appropriate process chamber, by an ALD process, a CVD process, a physical vapor deposition (PVD) process, and/or by another suitable process. After formation of the barrier metal layer 508, in a further embodiment of block 404, an anneal process may be optionally performed. Such an anneal process, for example, may include an in situ anneal process. By way of example, the in situ anneal process described herein may include an anneal process performed in the same process chamber used to deposit the barrier metal layer 508, while maintaining the vacuum of the process chamber. In some cases, the in situ anneal process may include transferring the device 500 to another process chamber fluidly connected to the process chamber used to deposit the barrier metal layer 508, while maintaining the device 500 under vacuum, and where the in situ anneal process is performed in the another fluidly connected process chamber. In some embodiments, the in situ anneal process may include a post metallization anneal (PMA) process. In various embodiments, such a PMA process may include a rapid thermal anneal (RTA) process such as a spike anneal, impulse anneal, laser anneal, or flash-assist anneal. In some embodiments, the PMA process may be performed at a temperature from about 800-1050° C. In various examples, a duration of the RTA process used to implement the PMA process may be from about 1 millisecond to a few tens of seconds. In some embodiments, the duration of the RTA process used to implement the PMA process may be from about 1-5 seconds. Additionally, in various embodiments, the in situ anneal process may include a PMA process employing a forming gas such as hydrogen, nitrogen, argon, and/or other appropriate gas. It is noted that RTA process used to implement the PMA process advantageously provides precise control of processing temperature and time.

Figure 5A:
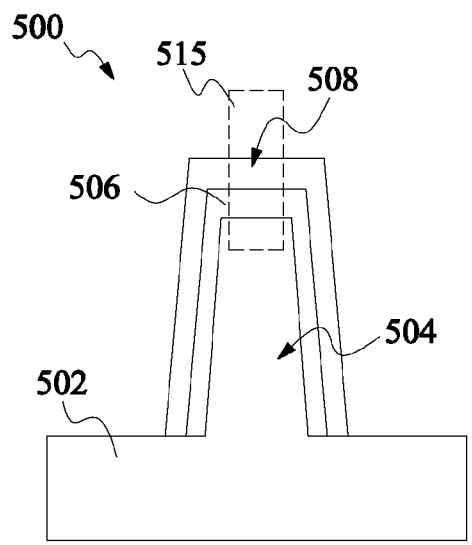
FIGS. 5A, 5B, 5C, and 5D illustrate cross sectional views of an embodiment of a FinFET device corresponding to one or more steps of the method of FIG. 4 and are provided along cross-sectional view substantially similar to section BB' of FIG. 1.
Figure 5B:
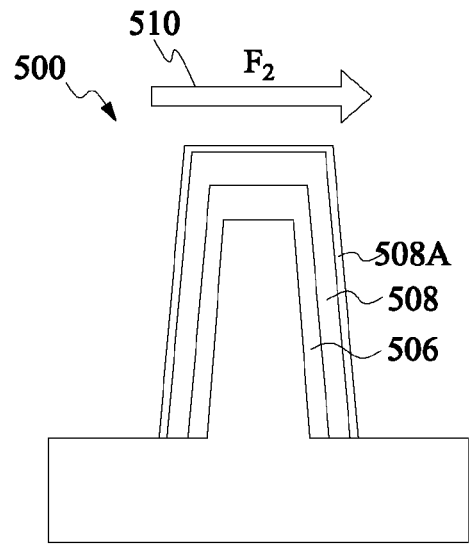

The method 400 then proceeds to block 406 where a thermal fluorine treatment is performed. Referring to the example of FIG. 5B, in an embodiment of block 406, a thermal fluorine treatment 510 is performed on the device 500. In some embodiments, and as illustrated in FIG. 5B, the thermal fluorine treatment 510 includes flowing fluorine ($F_2$) gas over device 500. In some embodiments, a flow rate of the fluorine gas is about 0.3-1.0 standard liters per minute (SLM). In various examples, the fluorine treatment 510 is performed at a temperature of about 250-300° C. In some embodiments, the duration of the fluorine treatment 510 is about 8-10 minutes. As used herein, the duration of the fluorine treatment 510 includes a time during which the fluorine gas is flowing over the device 500. However, in some embodiments, the duration of the thermal fluorine treatment 510 may further include pumping time, purging time, and/or other cycle time as described in more detail below with reference to FIG. 7. By way of example, the thermal fluorine treatment 510 may be performed using a TELINDY® or a TELINDY PLUS® Thermal Processing System, available from Tokyo Electron Limited, Tokyo, Japan.

As a result of the thermal fluorine treatment 510, and as shown in FIG. 5B, a portion of the barrier metal layer 508 becomes fluorinated, thereby forming a conformal fluorinated barrier metal layer 508A. In some embodiments, for example when the barrier metal layer 508 includes TiSiN, the conformal fluorinated barrier metal layer 508A includes fluorinated TiSiN (TiSiNF). In various embodiments, for example when other materials such as TiN, TaSiN, or TaN are used to form the barrier metal layer 508, the conformal fluorinated barrier metal layer 508A may include fluorinated TiN (TiNF), fluorinated TaSiN (TaSiNF), or fluorinated TaN (TaNF). While some examples of the conformal fluorinated barrier metal layer 508A have been given, those of ordinary skill in the art in possession of this disclosure will understand that other barrier metal layers may be used to form other fluorinated barrier metal layers (e.g., by way of the thermal fluorine treatment 510), while remaining within the scope of the present disclosure. It is noted that the conformal fluorinated barrier metal layer 508A is expected to include fluorine atoms which are substantially uniformly distributed throughout the conformal fluorinated barrier metal layer 508A. Thus, as described in more detail below, such a conformal and uniform distribution of fluorine atoms can be driven into (e.g., diffused into) the high-K gate stack 506 (e.g., following a subsequent anneal process) in order to conformally/uniformly passivate interfacial and/or bulk defects of the high-K gate stack 506 by way of the diffused fluorine atoms.

The method 400 then proceeds to block 408 where a capping layer is formed. Referring to the example of FIG. 5C, in an embodiment of block 408, a capping layer 512 is formed over the conformal fluorinated barrier metal layer 508A. In some embodiments, the capping layer 512 may include a Si layer, a dielectric layer (e.g., $SiO_2$), a nitride layer (e.g., $Si_3N_4$), and/or other suitable material. In various embodiments, the capping layer may be formed by an in-situ or ex-situ process. By way of example, the capping layer 512 may be deposited by an ALD process, a CVD process, a PVD process, and/or by another suitable process. In at least some embodiments, the capping layer 512 includes a CVD-deposited silicon layer. In some examples, the capping layer 512 may be used to advantageously mitigate outgassing of fluorine from the conformal fluorinated barrier metal layer 508A (e.g., during a subsequent anneal process). By way of example, formation of the capping layer 512 may be performed directly after the thermal fluorine treatment 510 (e.g., without unloading the device 500 from the processing system), where the same processing system is used both for the thermal fluorine treatment 510 and for the formation of the capping layer 512. Thus, in some embodiments, formation of the capping layer 512 may also be performed using a TELINDY® or a TELINDY PLUS® Thermal Processing System, available from Tokyo Electron Limited, Tokyo, Japan.

The method 400 then proceeds to block 410 where a post-capping anneal (PCA) process is performed. Still referring to the example of FIG. 5C, in an embodiment of block 410, a PCA process is performed, as indicated by arrows 514. In various embodiments, the PCA process 514 may include an RTA process (e.g., similar to that used for the PMA process described above), which may include a spike anneal, impulse anneal, laser anneal, or flash-assist anneal. In some embodiments, the PCA process 514 may be performed at a temperature from about 800-1050° C. In various examples, a duration of the RTA process used to implement the PCA process 514 may be from about 1 millisecond to a few tens of seconds. In some embodiments, the duration of the RTA process used to implement the PCA process 514 may be about 1-5 seconds. Additionally, in various embodiments, the PCA process 514 may employ a forming gas such as hydrogen, nitrogen, argon, and/or other appropriate gas. It is noted that RTA process used to implement the PCA process 514 advantageously provides precise control of processing temperature and time. It at least some examples, RTA processes described above may additionally be used to move and/or drive dopants from one material layer to another layer, or from a given material layer to a wafer substrate. For example, in some embodiments, the RTA process used to implement the PCA process 514 may be used to drive the fluorine atoms from the conformal fluorinated barrier metal layer 508A into the barrier metal layer 508 and the high-K gate stack 506. In various embodiments, the PCA process 514 may be tuned such that a majority of the fluorine atoms are driven into the high-K gate stack 506. Moreover, driving in of the fluorine atoms (which are conformally/uniformly distributed throughout the conformal fluorinated barrier metal layer 508A) may provide for conformal fluorine doping of the high-K gate stack 506, thereby effectively passivating interfacial and/or bulk defects of the high-K gate stack 506 by way of the diffused fluorine atoms.

The method 400 then proceeds to block 412 where the capping layer is removed. Referring to the example of FIG. 5D, in an embodiment of block 412, the capping layer 512 (FIG. 5C) may be removed. By way of example, the capping layer 512 may be removed using a selective dry etch process (e.g., RIE, ICP), a selective wet etch process, or other suitable process. In various embodiments, the etch process used to remove the capping layer 512 may be configured to stop on the conformal fluorinated barrier metal layer 508A or on the barrier metal layer 508. As illustrated in FIG. 5D, the barrier metal layer 508 (FIG. 5C) may become at least partially fluorinated after the PCA process 514, resulting in a fluorinated barrier metal layer 508B. Similarly, the high-K gate stack 506 (FIG. 5C) becomes conformally fluorinated (conformal fluoride doping), as described above, after the PCA process 514, resulting in a fluorinated high-K gate stack 506A. Moreover, in various embodiments, "conformal fluoride doping" of the high-K gate stack 506 is used herein describe doping of the interfacial and high-K dielectric layers of the high-K gate stack 506, wherein a fluorine concentration of a top portion of a particular high-K gate stack 506 layer (interfacial layer or high-K dielectric layer) formed over a top portion of a FinFET fin is substantially the same as a fluorine concentration of the same high-K gate stack 506 layer formed over a side portion of the FinFET fin. Thus, defects (interfacial/bulk) of both the interfacial layer and the high-K dielectric layer of the fluorinated high-K gate stack 506A are effectively passivated by the conformal fluorine doping. Thereafter, in various examples, a gate metal layer may be formed (e.g., over the barrier metal layer), and the device 500 may continue with further processing, as discussed below.

The semiconductor device 500 may undergo further processing to form various features and regions known in the art. For example, subsequent processing may form various contacts/vias/lines and multilayers interconnect features (e.g., metal layers and interlayer dielectrics) on the substrate 502, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 400, and some process steps described above may be replaced or eliminated in accordance with various embodiments of the method 400.

Referring now to FIGS. 6A-6E, illustrated therein are enlarged cross-sectional views of a portion of the device 500 in a region denoted by dashed box 515 (FIG. 5A), at various stages of processing according to one or more steps of the method 400 of FIG. 4. By way of illustration, the example of FIG. 6A substantially corresponds to the example of FIG. 5A and is likewise an embodiment of block 404 of the method 400, where the barrier metal layer 508 is formed over the high-K gate stack 506. The example of FIG. 6A also shows the high-K gate stack 506 in more detail, where the interfacial layer (IL) of the high-K gate stack 506 is formed over the fin element 504, and where the high-K dielectric layer (HK) of the high-K gate stack 506 is formed over the interfacial layer (IL). After formation of the barrier metal layer 508 over the high-K gate stack 506, an anneal process may be optionally performed, as discussed above.

Figure 6B:
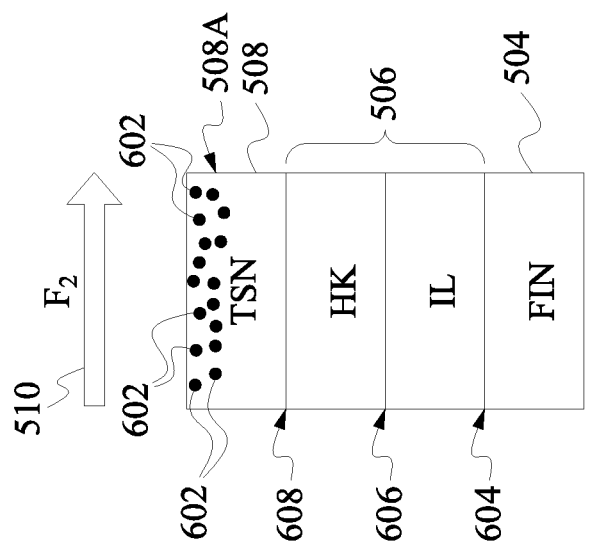
FIGS. 6A, 6B, 6C, 6D, and 6E illustrate enlarged cross sectional views of an embodiment of a FinFET device corresponding to one or more steps of the method of FIG. 4 and are provided along cross-sectional view substantially similar to section BB' of FIG. 1.
Figure 6A:
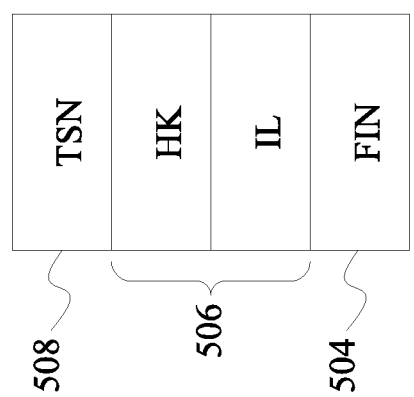

Continuing, FIG. 6B substantially corresponds to the example of FIG. 5B and is likewise an embodiment of block 406 of the method 400, where the thermal fluorine treatment 510 is performed. The example of FIG. 6B illustrates some aspects of the thermal fluorine treatment 510 in more detail. For example, FIG. 6B shows a plurality of fluorine atoms 602 which become embedded within the barrier metal layer 508 to thus form the conformal fluorinated barrier metal layer 508A. In embodiments when the barrier metal layer 508 includes TiSiN, the conformal fluorinated barrier metal layer 508A includes fluorinated TiSiN (TiSiNF). However, other barrier metal layer 508 materials may likewise be used to form other fluorinated barrier metal layers (e.g., by way of the thermal fluorine treatment 510), as discussed above. In various embodiments, the plurality of fluorine atoms 602 is substantially uniformly distributed throughout the conformal fluorinated barrier metal layer 508A. As described herein, the plurality of fluorine atoms 602 may be subsequently driven into (e.g., diffused into) the high-K gate stack 506 (e.g., following an anneal process), including into one or both of the interfacial layer (IL) and the high-K dielectric layer (HK) of the high-K gate stack 506. In some embodiments, the plurality of fluorine atoms 602 may also be distributed (e.g., following a subsequent anneal process) along one or more of a fin/IL interface 604, an IL/HK interface 606, and a HK/barrier metal layer interface 608. Thus, the plurality of fluorine atoms 602 may be used to effectively passivate bulk defects of the interfacial layer (IL) and the high-K dielectric layer (HK) high-K gate stack 506, as well as interfacial defects located at one or more of their respective interfaces 604, 606, 608.

Figure 5C:
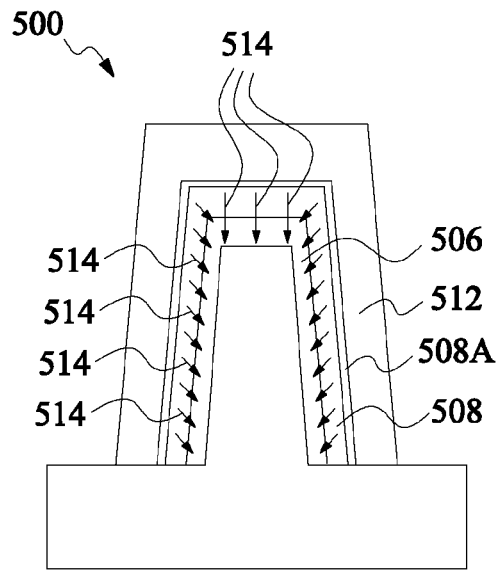
Figure 5D:
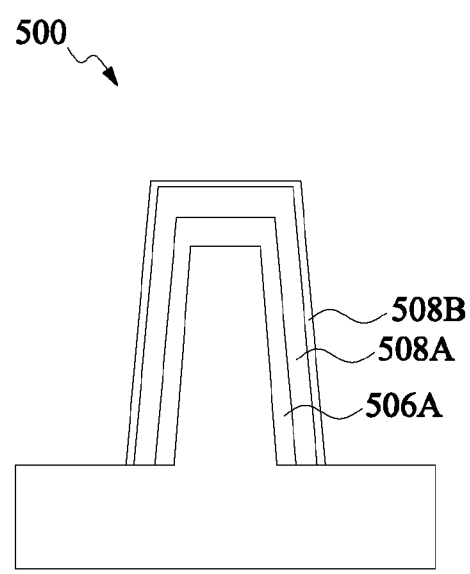
Figure 6E:
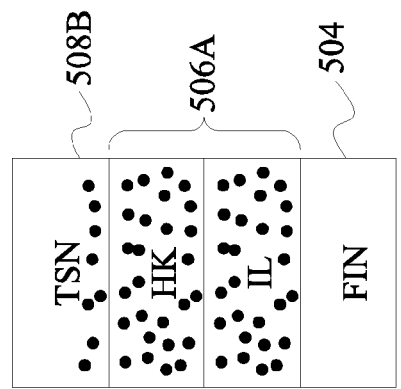
Figure 6D:
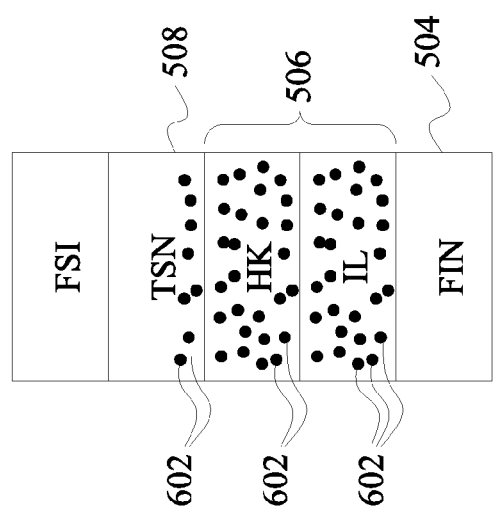
Figure 6C:
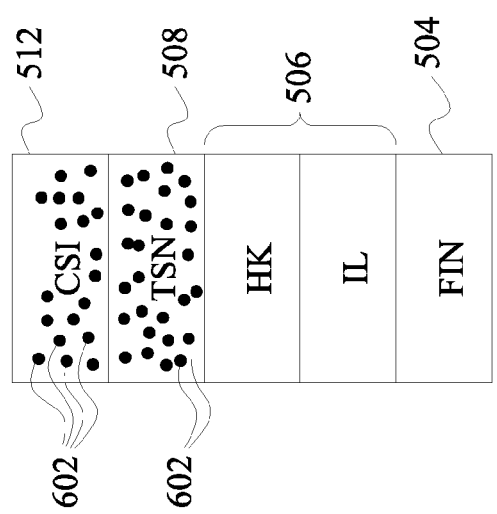

FIG. 6C substantially corresponds to the example of FIG. 5C and is likewise an embodiment of block 408 of the method 400, where the capping layer 512 is formed over the barrier metal layer 508, including over the conformal fluorinated barrier metal layer 508A. The example of FIG. 6C illustrates some aspects of the formation of the capping layer 512 in more detail. As described above, in at least some embodiments, the capping layer 512 may include a CVD-deposited silicon (or polysilicon) layer (denoted as CSI in FIG. 6C), for example using trichlorosilane ($SiHCl_3$) or silane ($SiH_4$) as a precursor gas. In some embodiments, the CVD deposition may be performed at a temperature of about 400° C. for about 2.5 hours, as discussed below in more detail with reference to FIG. 7. In some examples, the CVD deposition may be performed at a temperature up to, but less than or equal to, about 650° C. In some embodiments, for example when depositing the CVD silicon (or polysilicon) layer at elevated temperatures (e.g., in some cases even at 400° C.), atoms of the plurality of fluorine atoms 602 may at least partially diffuse/redistribute themselves both further into the barrier metal layer 508, as well as into the growing capping layer 512. Thus, in some examples, the CVD-deposited silicon (or polysilicon) layer (CSI) may become fluorinated and may then be denoted as FSI, as shown in FIG. 6D. To be sure, the capping layer 512 may include other materials such as a dielectric layer (e.g., $SiO_2$), a nitride layer (e.g., $Si_3N_4$), and/or other suitable material, which may similarly be deposited at an elevated temperature, and which may also result in at least partial diffusion/redistribution of atoms of the plurality of fluorine atoms 602, both further into the barrier metal layer 508, as well as into the growing capping layer 512. In addition, FIG. 6C illustrates that the conformal fluorinated barrier metal layer 508A may not remain confined to an upper portion of the barrier metal layer 508 (as perhaps originally deposited), but rather at least partially as a result of formation of the capping layer 512, the conformal fluorinated barrier metal layer 508A may become more broadly diffuse as atoms of the plurality of fluorine atoms 602 become redistributed.

Continuing, FIG. 6D includes an embodiment of block 410 of the method 400, where the PCA process is preformed, and FIG. 6D also substantially corresponds to the example of FIG. 5C. The example of FIG. 6D illustrates some aspects of the PCA process 514 in more detail. As described above, the RTA process used to implement the PCA process 514 may be used to drive atoms of the plurality of fluorine atoms 602 from the diffused conformal fluorinated barrier metal layer 508A, as well as from the fluorinated capping layer 512 (e.g., FSI), further into the barrier metal layer 508 and the high-K gate stack 506. In particular, atoms of the plurality of fluorine atoms 602 may be driven into (e.g., by the PCA process 514) one or both of the interfacial layer (IL) and the high-K dielectric layer (HK) of the high-K gate stack 506. As a result of the PCA process 514, and in some embodiments, atoms of the plurality of fluorine atoms 602 may also be distributed along one or more of the fin/IL interface 604, the IL/HK interface 606, and the HK/barrier metal layer interface 608. Thus, the plurality of fluorine atoms 602 may be used to effectively passivate bulk defects of the interfacial layer (IL) and the high-K dielectric layer (HK) high-K gate stack 506, as well as interfacial defects located at one or more of their respective interfaces 604, 606, 608. In some embodiments, the PCA process 514 may be tuned such that a majority of atoms of the plurality of fluorine atoms 602 are driven into the high-K gate stack 506 (e.g., as opposed to staying within the barrier metal layer 508). Moreover, embodiments of the present disclosure provide for driving in of the fluorine atoms 602 (previously conformally/uniformly distributed throughout the conformal fluorinated barrier metal layer 508A) to further provide, after the PCA process 514, conformal fluorine doping of the high-K gate stack 506. Thus, embodiments disclosed herein provide for effective passivation of interfacial and/or bulk defects of the high-K gate stack 506 by way of the plurality of fluorine atoms 602.

FIG. 6E substantially corresponds to the example of FIG. 5D and is likewise an embodiment of block 412 of the method 400, where the capping layer is removed. The example of FIG. 6E illustrates some aspects of the removal of the capping layer 512 in more detail. As described above, the capping layer 512 (or fluorinated capping layer 512 such as the layer FSI) may be removed using a selective dry etch process (e.g., RIE, ICP), a selective wet etch process, or other suitable process. In particular, as the atoms of the plurality of fluorine atoms 602 may be driven away from a top surface of the barrier metal layer 508 (e.g., by the PCA process 514), the etch process used to remove the capping layer may be configured to stop on the barrier metal layer 508. However, in some embodiments and as shown in FIG. 5D, at least a portion of the conformal fluorinated barrier metal layer 508A may remain (e.g., after the PCA process 514), and the etch process used to remove the capping layer may be configured to stop on the conformal fluorinated barrier metal layer 508A. FIG. 6E also illustrates the fluorinated barrier metal layer 508B and the fluorinated high-K gate stack 506A, formed by the PCA process 514 discussed above. Thereafter, in various embodiments, a gate metal layer may be formed over the fluorinated barrier metal layer 508B, and the device 500 may undergo further processing, as discussed above.

Figure 7:
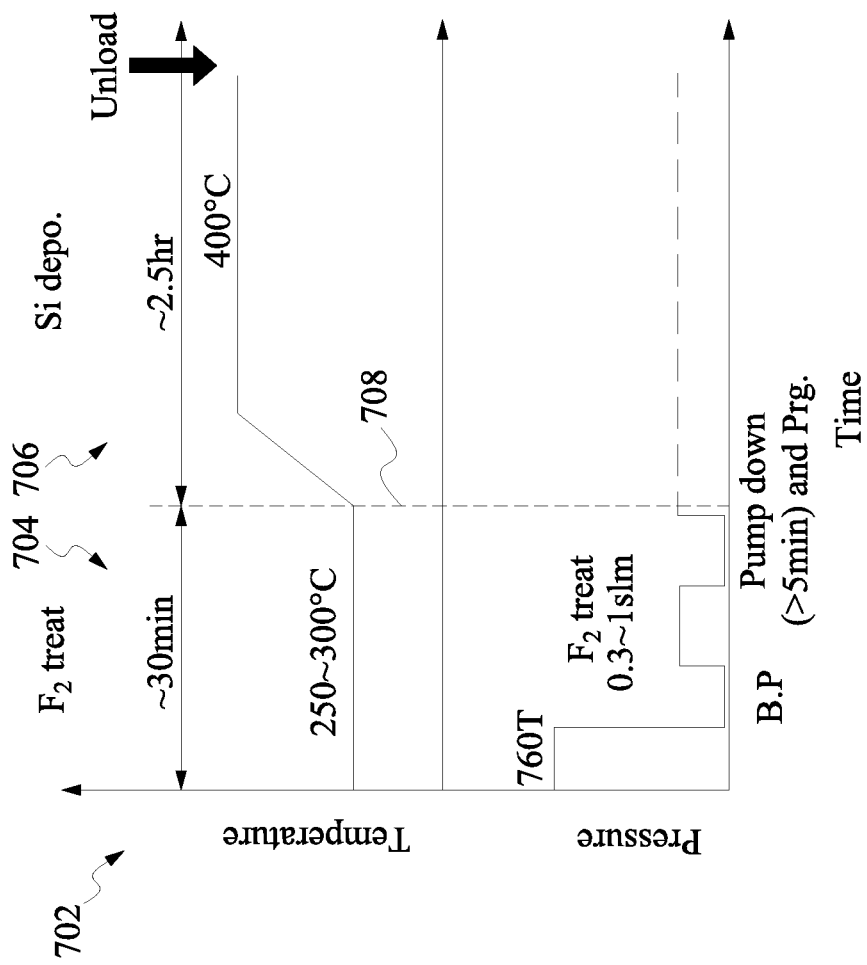
FIG. 7 is a process design chart of a method of fabricating a FinFET device according to one or more aspects of the present disclosure.

Referring now to FIG. 7, illustrated therein is a process design chart 702 corresponding to the thermal fluorine treatment 510 (e.g., discussed above with reference to FIG. 5B) and deposition of the capping layer 512 (e.g., discussed above with reference to FIG. 5C). In particular, the process design chart 702 shows temperature and pressure, as a function of time, for each of the thermal fluorine treatment (e.g., block 406 of the method 400) and the capping layer formation (e.g., block 408 of the method 400). By way of example, a first portion 704 of the process design chart 702 corresponds to the thermal fluorine treatment, and a second portion 706 of the process design chart 702 corresponds to the capping layer formation. In some embodiments, a total duration of the first portion 704 may be about 30 minutes, and a total duration of the second portion 706 may be about 2.5 hours. The first and second portions 704, 706 are illustrated in FIG. 7 separated by a dashed line 708.

In various embodiments, after the barrier metal formation and optional anneal of block 404 of the method 400, a thermal fluorine treatment method (block 406) may begin. Referring to the first portion 704 of the process design chart 702, the thermal fluorine treatment method may begin by, after loading the device 500 into an appropriate processing system, setting the temperature to a thermal fluorine treatment temperature (e.g., about 250-300° C.) with the pressure set to atmospheric pressure (e.g., 760 Torr). The pressure (e.g., of the processing system) may then be pumped down to a system base pressure (BP) and held at the system BP for several minutes. Thereafter, in some embodiments, fluorine ($F_2$) gas is introduced to flow over the device 500, for example, at a flow rate of about 0.3-1.0 standard liters per minute (SLM). As illustrated in FIG. 7, flow of the fluorine gas increases the pressure of the processing system. As shown, the temperature of the processing system remains at a temperature of about 250-300° C. during the fluorine gas flow, and the duration of the fluorine gas flow over the device 500 is about 8-10 minutes. While the thermal fluorine treatment method (block 406), as described herein, may generally correspond to the first portion 704, a duration of the fluorine treatment 510 (e.g., which introduces fluorine atoms into the barrier metal layer 508) may be used to describe a time during which the fluorine gas is flowing over the device 500. After the fluorine treatment 510, the processing system is purged (e.g., of the fluorine gas) and pumped down (e.g., to the system BP). In some cases, such a purge and pump down cycle may have a duration greater than about 5 minutes.

After the thermal fluorine treatment method (block 406), the capping layer formation method (block 408) may begin. Referring now to the second portion 706 of the process design chart 702, the capping layer formation method may begin by, after the purge and pump down cycle described above, ramping the temperature to a capping layer deposition temperature of about 400° C. and a pressure of about 0.1-10 Torr. In some embodiments, for example as illustrated in FIG. 7, the pressure (e.g., of the processing system) may be substantially constant during the capping layer formation method. In some embodiments, a duration of the capping layer formation method (second portion 706) may be about 2.5 hours. In some cases, the duration of the capping layer formation method includes the temperature ramp-up time (e.g., from the temperature of the fluorine treatment method to the temperature of the capping layer formation method). In various embodiments, during the capping layer formation method, and at substantially the temperature and pressure illustrated in FIG. 7, the capping layer 512 may be deposited (e.g., by ALD, CVD, and/or by another suitable process). In at least some embodiments, during the capping layer formation method, a CVD-deposited silicon layer is deposited to form the capping layer 512. In some embodiments, after formation of the capping layer 512, the device 500 may be unloaded from the processing system (e.g., to undergo further processing).

Figures 8A, 8B, 8C:
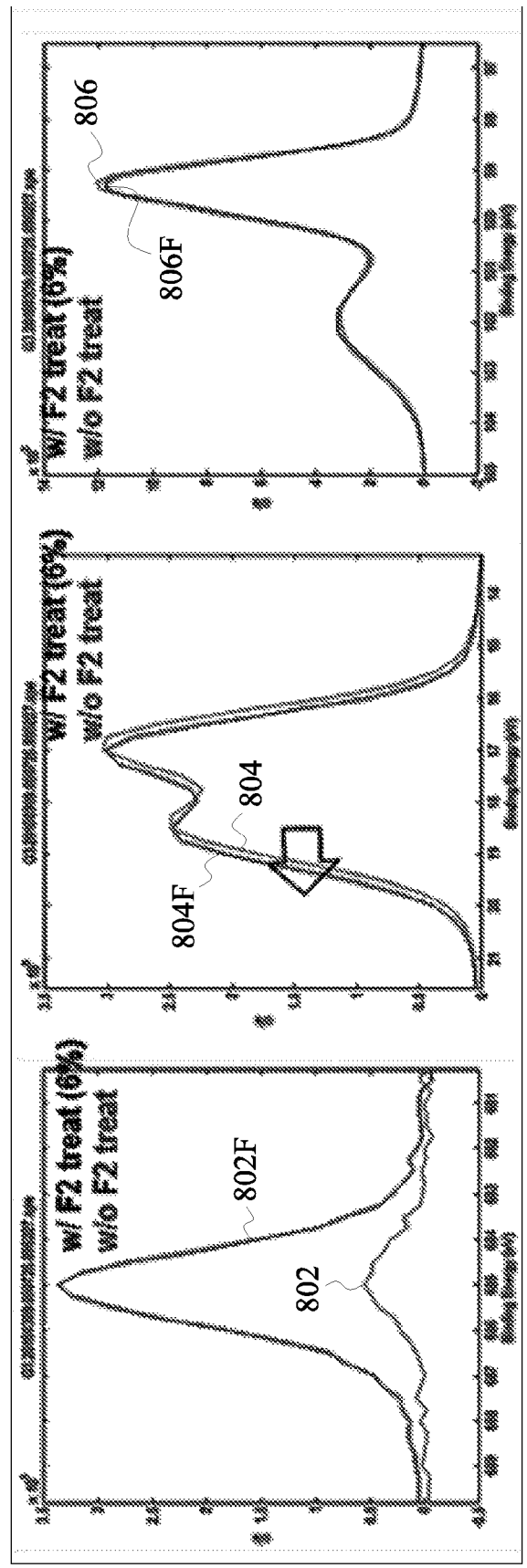
FIGS. 8A, 8B, and 8C illustrate X-ray photoelectron spectroscopy (XPS) spectra illustrating aspects of the surface chemistry before and after fluorine incorporation, according to some embodiments.

Referring now to FIGS. 8A-8C, illustrated therein are X-ray photoelectron spectroscopy (XPS) spectra illustrating aspects of the surface chemistry (e.g., of the device 500) before and after fluorine incorporation, according to some embodiments. In particular, FIGS. 8A-8C, illustrate proper bonding and concentrations of the various constituent elements (including fluorine) that make up one or more layers of the device 500 (e.g., layers of the high-K gate stack 506). By way of illustration, the examples of FIGS. 8A-8C may be described with reference to a high-K gate stack 506 including $HfO_2$ and a Si fin element 504. For example, FIG. 8A provides an F1s XPS spectra 802 for a device without fluorine treatment and an F1s XPS spectra 802F for a device with fluorine treatment (6% fluorine). As known in the art, the F1s XPS region is the primary XPS region for fluorine. Thus, the XPS spectra of FIG. 8A illustrate that fluorine is detected in the interfacial layer and high-K dielectric layer of the high-K gate stack 506 for devices employing embodiments of the thermal fluorine treatment method described herein. FIG. 8B provides an Hf4f XPS spectra 804 for a device without fluorine treatment and an Hf4f XPS spectra 804F for a device with fluorine treatment (6% fluorine). As known in the art, the Hf4f XPS region is the primary XPS region for hafnium. In addition, fluorine incorporation is known to induce chemical shifts in other elements, such as hafnium. Thus, the XPS spectra of FIG. 8B illustrate the formation of Hf—F bonds (e.g., within the high-K gate stack 506) for devices including an $HfO_2$ gate dielectric layer and employing embodiments of the thermal fluorine treatment method described herein. FIG. 8C provides a Si2p XPS spectra 806 for a device without fluorine treatment and a Si2p XPS spectra 806F for a device with fluorine treatment (6% fluorine). As known in the art, the Si2p XPS region is the primary XPS region for silicon. Thus, the XPS spectra of FIG. 8C illustrate interfacial layer regrowth, including a $SiO_2$ interfacial layer in the present example (e.g., as illustrated by the left-hand peak of the Si2p XPS spectra of FIG. 8C), for devices employing embodiments of the thermal fluorine treatment method described herein, similar to the interfacial layer observed for devices that do not employ the thermal fluorine treatment method. While the examples of FIGS. 8A-8C illustrated embodiments having about 6% fluorine, such a fluorine concentration is not meant to be limiting in any way. For example, in various embodiments, a fluorine concentration (e.g., incorporated into the high-K gate stack 506) may be from about 2-6%.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures for providing conformal doping of FinFET fin structures, for example by way of a thermal treatment process, so as to avoid damage caused by ion implantation and to provide conformal/uniform doping of three-dimensional FinFET fin structures (e.g., on all sides of the three-dimensional structure). In some embodiments, after formation of a FinFET gate stack over FinFET fin structure and prior to formation of a gate metal layer, a fluorine treatment may be performed. For example, in some embodiments, a layer of titanium silicon nitride (TiSiN) may be formed over a high-K dielectric layer of the FinFET gate stack. In some examples, an in situ PMA process may then be performed. Thereafter, in various embodiments, a thermal fluorine treatment process may be performed such that a portion of the TiSiN layer becomes fluorinated, thereby forming a fluorinated layer of TiSiN. In some embodiments, a capping layer may then be formed over the fluorinated layer of TiSiN. In various illustrations, a PCA process is performed to drive-in fluorine atoms into the FinFET gate stack, thereby passivating interfacial and/or bulk defects for any of a plurality of layers which make up the FinFET gate stack. In various embodiments, after the PCA, the capping layer may be removed, and the FinFET gate metal layer may be formed.

Thus, one of the embodiments of the present disclosure described a method for fabricating a semiconductor device (e.g., a FinFET device), where the method includes forming a gate stack at least partially over a fin extending from a substrate. In various embodiments, a barrier metal layer is deposited over the gate stack. By way of example, a thermal fluorine treatment is performed, where the thermal fluorine treatment forms a fluorinated layer within the barrier metal layer, and where the fluorinated layer includes a plurality of fluorine atoms. In some embodiments, after forming the fluorinated layer, an anneal is performed to drive at least some of the plurality of fluorine atoms into the gate stack (e.g., into the interfacial layer and the high-K dielectric layer), thereby conformally doping the gate stack with the at least some of the plurality of fluorine atoms.

In another of the embodiments, discussed is a method where an interfacial layer is formed over a fin extending from a substrate and a gate dielectric layer is formed over the interfacial layer. In various embodiments, a barrier metal layer is deposited over the gate dielectric layer. Thereafter, in some embodiments, a thermal fluorine treatment process may be performed. By way of illustration, the thermal fluorine treatment process may include flowing a fluorine ($F_2$) gas over the barrier layer at a processing temperature substantially equal to a thermal fluorine treatment temperature. In some embodiments and responsive to flowing the fluorine ($F_2$) gas over the barrier layer at the thermal fluorine treatment temperature, a plurality of fluorine atoms may be introduced into a first portion of the barrier metal layer to form a fluorinated barrier metal layer. In various examples, a rapid thermal anneal (RTA) process is then performed to drive at least some of the plurality of fluorine atoms into the interfacial layer and the gate dielectric layer and thereby passivate bulk and/or interfacial defects therein.

In yet another of the embodiments, discussed is a semiconductor device including a substrate having a fin, an interfacial layer having a top interfacial portion formed over a top portion of the fin and a side interfacial portion formed over a side portion of the fin, a high-K dielectric layer having a top high-K portion formed over the top interfacial portion and a side high-K portion formed over the side interfacial portion, and a barrier metal layer formed over the high-K dielectric layer. In various examples, the interfacial layer and the high-K dielectric layer are conformally doped (e.g., with fluorine atoms). For example, in various embodiments, the top interfacial portion and the side interfacial portion have substantially the same concentration of fluorine atoms, and the top high-K portion and the side high-K portion have substantially the same concentration of fluorine atoms.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
   forming a gate stack at least partially over a fin extending from a substrate;
   depositing a barrier metal layer over the gate stack;
   performing a thermal fluorine treatment, wherein the thermal fluorine treatment forms a fluorinated layer within the barrier metal layer, and wherein the fluorinated layer includes a plurality of fluorine atoms; and
   after forming the fluorinated layer, performing an anneal to drive at least some of the plurality of fluorine atoms into the gate stack, thereby doping the gate stack with the at least some of the plurality of fluorine atoms.

2. The method of claim 1, further comprising:
   after forming the fluorinated layer and prior to performing the anneal, forming a capping layer over the fluorinated layer.

3. The method of claim 2, wherein forming the capping layer includes forming a chemical vapor deposition (CVD)-deposited silicon layer.

4. The method of claim 1, wherein the anneal includes a rapid thermal anneal (RTA) process.

5. The method of claim 1, wherein the gate stack includes an interfacial layer formed at least partially over the fin and a gate dielectric layer formed over the interfacial layer, and wherein the barrier metal layer is deposited over the gate dielectric layer.

6. The method of claim 1, wherein the performing the anneal to drive at least some of the plurality of fluorine atoms into the gate stack conformally dopes the gate stack with the at least some of the plurality of fluorine atoms.

7. The method of claim 1, wherein the depositing the barrier metal layer includes depositing a titanium silicon nitride (TiSiN) layer.

8. The method of claim 7, wherein the fluorinated layer includes a fluorinated TiSiN layer.

9. The method of claim 1, further comprising:
   after depositing the barrier metal layer and prior to performing the thermal fluorine treatment, performing a post metallization anneal (PMA) process.

10. The method of claim 1, wherein the performing the thermal fluorine treatment includes flowing fluorine ($F_2$) gas over the barrier metal layer at a temperature of about 250-300° C.

11. The method of claim 2, further comprising:
    removing the capping layer; and
    forming a gate metal layer over the barrier metal layer.

12. A method, comprising:
forming an interfacial layer over a fin extending from a substrate and forming a gate dielectric layer over the interfacial layer;
depositing a barrier metal layer over the gate dielectric layer;
performing a thermal fluorine treatment process, wherein the thermal fluorine treatment process includes:
flowing a fluorine ($F_2$) gas over the barrier layer at a processing temperature substantially equal to a thermal fluorine treatment temperature; and
responsive to flowing the fluorine ($F_2$) gas over the barrier layer at the thermal fluorine treatment temperature, introducing a plurality of fluorine atoms into a first portion of the barrier metal layer to form a fluorinated barrier metal layer; and
performing a rapid thermal anneal (RTA) process to drive at least some of the plurality of fluorine atoms into the interfacial layer and the gate dielectric layer.

13. The method of claim 12, further comprising:
after performing the thermal fluorine treatment process and prior to performing the RTA process, performing a capping layer deposition process including:
ramping the processing temperature from the thermal fluorine treatment temperature to a capping layer deposition temperature; and
depositing a capping layer over the fluorinated barrier metal layer at the capping layer deposition temperature.

14. The method of claim 13, further comprising:
responsive to the depositing the capping layer at the capping layer deposition temperature, at least partially redistributing the plurality of fluorine atoms from the fluorinated barrier metal layer into both a second portion of the barrier metal layer and into the capping layer, thereby forming a fluorinated capping layer.

15. The method of claim 12, wherein the performing RTA process drives at least some of the plurality of fluorine atoms to one or more of a fin/interfacial layer interface, an interfacial layer/gate dielectric layer interface, and a gate dielectric layer/barrier metal layer interface.

16. The method of claim 14, further comprising:
removing the fluorinated capping layer; and
forming a gate metal layer over the fluorinated barrier metal layer.

17. The method of claim 12, wherein the at least some of the plurality of fluorine atoms passivate bulk and interfacial defects of each of the interfacial layer and the gate dielectric layer.

18. A method of fabricating a semiconductor device, comprising:
depositing a nitride-containing barrier layer over a high-K gate stack, the high-K gate stack disposed over a fin extending from a substrate;
flowing a fluorine gas over the semiconductor device at a temperature greater than room temperature, wherein the flowing the fluorine gas forms a conformal fluorinated layer within the nitride-containing barrier layer, and wherein the conformal fluorinated layer includes a plurality of fluorine atoms;
forming a capping layer over the conformal fluorinated layer;
after forming the capping layer, performing a rapid thermal anneal process to drive at least some of the plurality of fluorine atoms into the high-K gate stack and into an interfacial layer disposed below the high-K gate stack;
wherein the nitride-containing barrier layer prevents outgassing of the plurality of fluorine atoms during the rapid thermal anneal process.

19. The method of claim 18, wherein the nitride-containing barrier layer includes titanium silicon nitride (TiSiN), titanium nitride (TiN), tantalum silicon nitride (TaSiN), or tantalum nitride (TaN).

20. The method of claim 18, further comprising:
after performing the rapid thermal anneal process, removing the capping layer; and
forming a gate metal layer over the nitride-containing barrier layer.

* * * * *